(12) United States Patent
Yoon

(10) Patent No.: US 8,811,055 B2
(45) Date of Patent: Aug. 19, 2014

(54) SEMICONDUCTOR MEMORY DEVICE

(75) Inventor: Tae-Young Yoon, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 48 days.

(21) Appl. No.: 13/615,302

(22) Filed: Sep. 13, 2012

(65) Prior Publication Data

US 2013/0070507 A1    Mar. 21, 2013

(30) Foreign Application Priority Data

Sep. 19, 2011    (KR) .................. 10-2011-0094226

(51) Int. Cl.
*G11C 5/02* (2006.01)
*G11C 7/22* (2006.01)

(52) U.S. Cl.
CPC ... *G11C 5/02* (2013.01); *G11C 7/22* (2013.01)
USPC ...................... 365/51; 365/189.05

(58) Field of Classification Search
CPC .................................. G11C 5/02; G11C 7/22
USPC ............................... 365/51, 189.05
See application file for complete search history.

(56) References Cited

U.S. PATENT DOCUMENTS

| | | | | |
|---|---|---|---|---|
| 6,392,304 B1 * | 5/2002 | Butler | ............. | 257/777 |
| 6,507,115 B1 * | 1/2003 | Hofstee et al. | ............. | 257/777 |
| 7,009,303 B2 * | 3/2006 | Kuroda et al. | ............. | 257/777 |
| 7,136,978 B2 * | 11/2006 | Miura et al. | ............. | 711/165 |
| 7,327,600 B2 * | 2/2008 | Norman | ............. | 365/158 |
| 7,538,418 B2 * | 5/2009 | Nishizawa et al. | ............. | 257/679 |
| 8,407,538 B2 * | 3/2013 | Huh et al. | ............. | 714/719 |
| 8,564,093 B2 * | 10/2013 | Kuroda | ............. | 257/531 |
| 8,659,136 B2 * | 2/2014 | Youn et al. | ............. | 257/686 |

FOREIGN PATENT DOCUMENTS

| | | |
|---|---|---|
| JP | 2005072252 A | 3/2005 |
| JP | 2007250935 A | 9/2007 |
| JP | 2009004528 A | 1/2009 |
| KR | 100384745 B1 | 5/2003 |

* cited by examiner

*Primary Examiner* — Michael Tran
(74) *Attorney, Agent, or Firm* — Sughrue Mion, PLLC

(57) ABSTRACT

A memory device is provided. The memory device includes a first semiconductor chip including a memory element and a peripheral circuit configured to write or read data in or from the memory element; and a second semiconductor chip configured to perform an input/output function of data or signals exchanged between an external device and the first semiconductor chip.

27 Claims, 20 Drawing Sheets

SEMICONDUCTOR MEMORY DEVICE

CROSS-REFERENCE TO RELATED APPLICATIONS

This application claims priority from Korean Patent Application No. 10-2011-0094226 filed Sep. 19, 2011, the entirety of which is incorporated by reference herein.

BACKGROUND

Devices, apparatuses, and articles of manufacture consistent with the present disclosure relate to a semiconductor memory device, and more particularly, relate to a semiconductor memory device which has an input/output function implemented by a separate chip.

Mobile devices such as a smart phone, a tablet PC, a digital camera, an MP3 player, a PDA, and the like may be used widely. Such mobile devices may have a dynamic random access memory (DRAM) or a nonvolatile memory device. The integration of memory devices may increase according to a need for a high density, particularly in mobile devices.

However, it is technically difficult to apply the same design rule to all components of a semiconductor memory. In addition, a stack-type multi-chip technique for stacking memory devices tends to improve the integration. A wiring rearranging process, for example, may be used to stack the same types of memory devices and to electrically connect the stacked memory devices with an external device. However, such a wiring rearranging process may increase a cost and lower the reliability of a memory device.

Accordingly, although a design rule may be applied to increase integration, a yield may be decreased. That is, there may be a trade-off between the design rule and the yield.

SUMMARY

According to an aspect of an exemplary embodiment, there is provided a memory device comprising a first semiconductor chip including a memory element and a peripheral circuit configured to write or read data in or from the memory element; and a second semiconductor chip configured to perform an input/output function of data or signals exchanged between an external device and the first semiconductor chip.

According to an aspect of an exemplary embodiment, there is provided a memory device comprising a printed circuit board substrate; a first core chip provided on the printed circuit board substrate; a first input/output circuit chip provided on the printed circuit board substrate and configured to perform an input/output function of data or signals input or output to or from the first core chip; a second core chip stacked on the first core chip; and a second input/output circuit chip stacked on the first core chip and configured to perform an input/output function of data or signals input or output to or from the second core chip, wherein the first input/output chip and the second input/output circuit chip are located on the printed circuit board so as to minimize a number of bonding wires between the first core chip and the second core chip.

According to an aspect of an exemplary embodiment, there is provided a memory device comprising a printed circuit board substrate; a first core chip provided on the printed circuit board substrate; a first input/output circuit chip provided on the printed circuit board substrate and at a side of the first core chip and configured to perform an input/output function of data input and output to and from the first core chip; and a second core chip stacked on the first core chip and the first input/output circuit chip.

According to an aspect of an exemplary embodiment, there is provided a memory device comprising a cell array including a plurality of memory elements; and a peripheral circuit configured to write or read data in or from the memory elements, wherein an input/output circuit that transfers data to the peripheral circuit or outputs data from the peripheral circuit is provided outside the memory device.

BRIEF DESCRIPTION OF THE FIGURES

The above and other aspects will become apparent from the following description with reference to the following figures, wherein like reference numerals refer to like parts throughout the various figures unless otherwise specified, and wherein.

DETAILED DESCRIPTION

Figure 1:
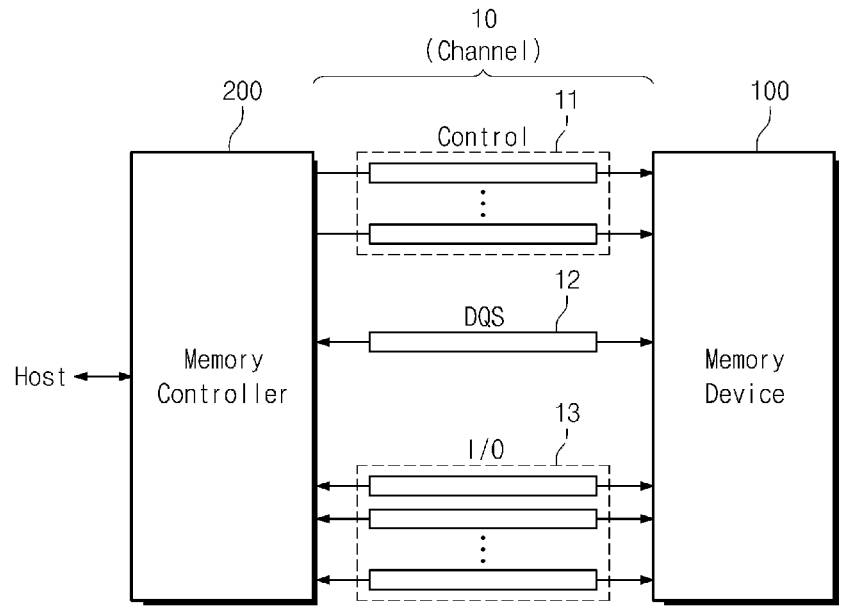
FIG. 1 is a block diagram schematically illustrating a storage device according to an exemplary embodiment.

Exemplary embodiments are described more fully hereinafter with reference to the accompanying drawings, in which exemplary embodiments of the inventive concept are shown. The inventive concept may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a storage device according to an exemplary embodiment. Referring to FIG. 1, a storage device may include a memory device 100, a memory controller 200, and a channel 10 formed of a plurality of signal lines.

The memory controller 200 may control the memory device 100 to write or read data in response to a write or read request of a host. The memory controller 200 may transfer data or a control signal to the memory device 100 according to an access request of the host. The memory controller 200 may detect and correct an error of data read out from the memory device 100. The memory controller 200 may use a strobe signal DQS upon exchanging of data with the memory device 100.

The memory device 100 may include volatile memory elements, which lose their data at power-off, or nonvolatile memory elements which retain their data even at power-off. The memory device 100 may be supplied with control signals from the memory controller 200. The control signals may be provided via control signal lines 11.

The memory device 100 may exchange the strobe signal DQS and data with the memory controller 200. The strobe signal DQS may be transferred between the memory device 100 and the memory controller 200 via a DQS signal line 12, and the data may be exchanged between the memory device 100 and the memory controller 200 via data lines (I/O) 13. The strobe signal DQS may be a signal for providing a reference time which is used to determine a logic value of data. When data is exchanged in a high speed, the strobe signal DQS may be used to provide a point of time for exactly determining input/output data.

The memory device 100 according to an exemplary embodiment may include an input/output circuit chip for exchanging signals and data with the memory controller 200 and a core chip for storing and reading out data. The input/output circuit chip may include elements for exchanging data and signals with the memory controller 200. Accordingly, it may be possible to exchange high-reliability data and signals. High-density memory elements may be formed at the core chip. Further, the core chip can be formed of a multi-chip that at least two chips are stacked.

It may be possible to transfer high-performance data and signals by implementing an input/output circuit by a separate chip. For example, the input/output circuit chip may include an electro-static discharge (ESD) protection circuit, an impedance matching circuit, or a de-emphasis driver for transferring output data in a signal manner for reducing power, separately from a data input/output buffer and an input/output driver. The impedance matching circuit or the de-emphasis driver may cause an increase in chip size. A design rule may be flexibly applied by implementing an input/ output circuit by a separate chip. Accordingly, it may be possible to implement a high-density and high-reliability memory device.

Figure 2:
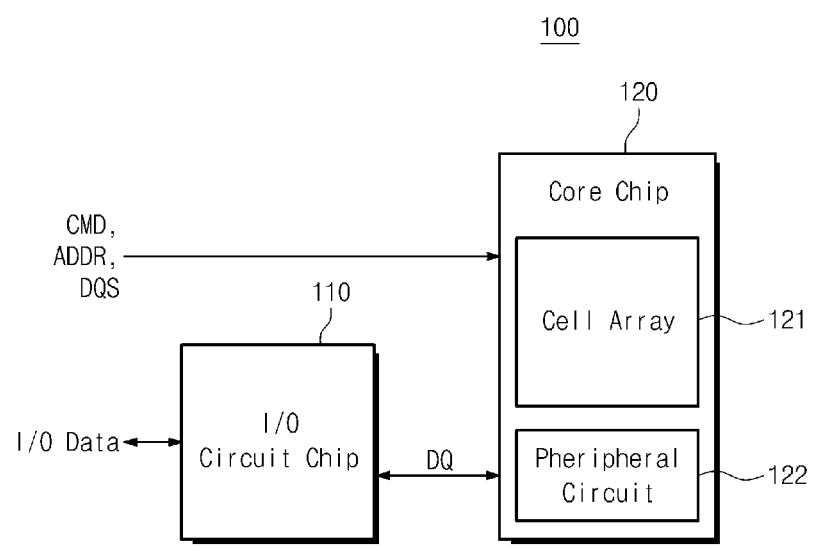
FIG. 2 is a block diagram illustrating a memory device according to an exemplary embodiment.

FIG. 2 is a block diagram illustrating a memory device according to an exemplary embodiment. Referring to FIG. 2, a memory device 100 according to an exemplary embodiment may include an input/output (I/O) circuit chip 110 and a core chip 120.

The input/output circuit chip 110 may receive data input from the outside of the memory device 100. The input/output circuit chip 110 may buffer the input data to transfer the data to the core chip 120. The input/output circuit chip 110 may buffer data output from the core chip 120 to output the data to an external device.

The input/output circuit chip 110 may include a data input buffer, an input driver, an output driver, and the like for execution of the above-described operations. The input/output circuit chip 110 may further include a de-emphasis driver to reduce power associated with output data and to provide reliable data.

The input/output circuit chip 110 may include circuits for providing reliable input data or output data. For example, the input/output circuit chip 110 may include an Electro-Static Discharge (ESD) circuit for protecting elements of the memory device 100 from the electro-static discharge. The input/output circuit chip 110 may include an impedance matching circuit for impedance matching with an external channel of the memory device 100. The input/output circuit chip 110 can include a parallel-to-serial converter.

The core chip 120 may write or read data in or from a cell array 121 based on control signals (e.g., an address, a strobe signal, and the like) from an external device. For example, if a write command is input, the core chip 120 may write data input via the input/output circuit chip 110 in a memory region appointed by an address. In the event that a read command is input, the core chip 120 may read data of a memory region appointed by an address to transfer the read data to the input/output circuit chip 110. A peripheral circuit 122 may be activated to access the cell array 121, based on a command CMD, an address ADDR, and a control signal.

With the above-described memory device 100, the input/output circuit chip 110 may be implemented by a separate chip die separated from the core chip 120. Accordingly, it may be possible to make the input/output circuit chip 110 and the core chip 120 according to different design rules. Further, various circuits can be additionally included within the input/output circuit chip 110.

Still further, the input/output circuit chip 110 can include intellectual properties for which it is difficult to scale down the minimum feature size, and the core chip 120 can include elements which are easy to scale down the minimum feature size. In the event that a memory device is implemented in the above-described manner, a yield may be improved by the input/output circuit chip 110. It may be possible to make a high-density memory device by the core chip 120 suitable for the high integration. As a result, the I/O circuit chip 110 may provide various additional functions and reliable input/output data. According to an exemplary embodiment, it may be possible to implement the memory device with high density and high reliability.

Figure 3:
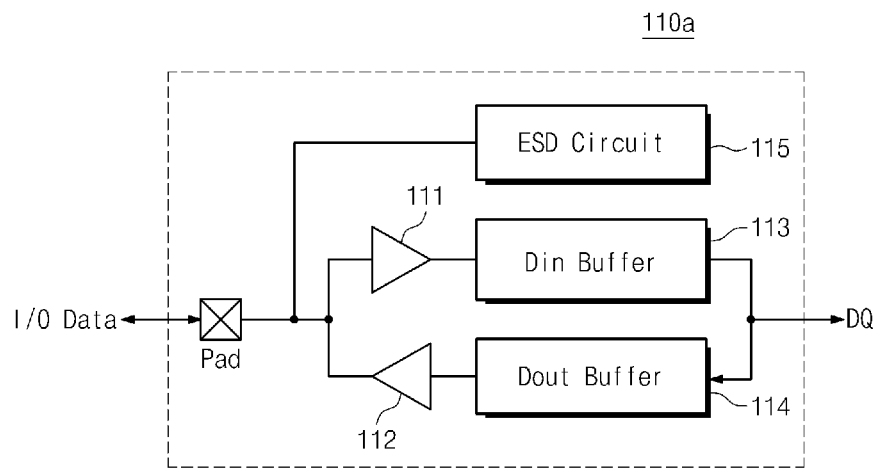
FIG. 3 is a block diagram schematically illustrating an input/output circuit chip according to an exemplary embodiment.

FIGS. 3 through 6 are block diagrams schematically illustrating exemplary embodiments of an input/output circuit chip in FIG. 2. FIG. 3 is a block diagram schematically illustrating an input/output circuit chip according to an exemplary embodiment. Referring to FIG. 3, an input/output circuit chip 110a may include an input driver 111, an output driver 112, a data input (Din) buffer 113, a data output (Dout) buffer 114, and an ESD circuit 115. Herein, the input driver 111, the output driver 112, and the ESD circuit 115 may be electrically connected to a pad.

The input driver 111 may adjust input data transferred via the pad into a signal processing level within a memory device 100. The input driver 111, for example, may convert data transferred using a differential signal into a single-level (e.g., CMOS level) signal to provide the single-level signal to the data input buffer 113.

The output driver 112 may be driven in a manner opposite to the input driver 113. Output data from a core chip 120 may be sent to the output driver 112 via the data output buffer 114. The output driver 112 may convert a single-level signal into a differential signal.

The data input buffer 113 may buffer data input via the pad. Although not shown in figures, the data buffered in the data input buffer 113 may be provided to the core chip 120 in synchronization with a clock signal. The data output buffer 114 may buffer data read out from the core chip 120. The buffered data in the data output buffer 114 may be output to an external device by an input/output unit in synchronization with a clock signal.

The ESD circuit 115 may include elements for protecting internal elements of a memory device from high-voltage ESD flowing in from an external device via the pad. For example, the ESD circuit 115 may include diodes or transistors broken down instead of internal elements of the memory device. Alternatively, the ESD circuit 115 may be formed of discharge elements capable of discharging charges corresponding to static electricity.

Since constituent elements such as the input driver 111 or the output driver 112 are formed of high-current devices, it may be difficult to reduce the minimum feature size. Since the data input buffer 113 and the data output buffer 114 are formed of devices capable of inputting and outputting data in a high speed, they may be unsuitable for the high integration as compared with memory elements of a cell array 121 (refer to FIG. 2). Since the ESD circuit 115 is formed of high-voltage elements, it may be difficult to scale down the minimum feature size. Accordingly, it may be easy to implement a high-integration core chip 120 by locating elements unsuitable for the high integration (i.e., unscalable elements) at the input/output circuit chip 110a collectively. Semiconductor elements or conductive lines for implementing the above-described elements can be formed at the input/output circuit chip 110a.

Figure 4:
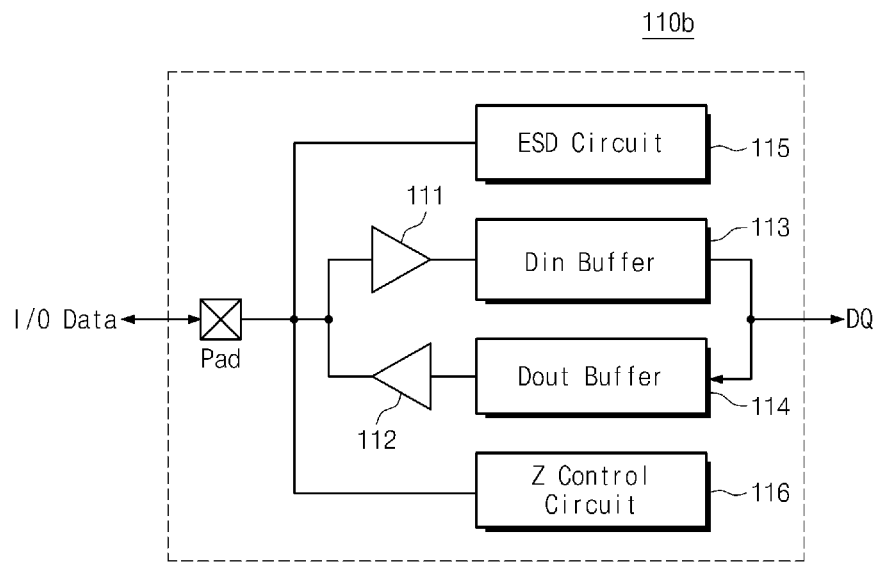
FIG. 4 is a block diagram schematically illustrating an input/output circuit chip according to another exemplary embodiment.

FIG. 4 is a block diagram schematically illustrating an input/output circuit chip according to another exemplary embodiment. Referring to FIG. 4, an input/output circuit chip 110b may include an input driver 111, an output driver 112, a data input (Din) buffer 113, a data output (Dout) buffer 114, an ESD circuit 115, and an impedance control circuit (Z Control Circuit) 116. Herein, the input driver 111, the output driver 112, the ESD circuit 115, and the impedance control circuit 116 may be electrically connected to a pad. The constituent elements 111, 112, 113, 114, and 115 in FIG. 4 may be substantially identical to those in FIG. 3, and description thereof is thus omitted.

The impedance control circuit 116 may control a termination impedance of the pad considering a characteristic impedance of a data line or a signal line. If impedance is not matched, a reflection rate of input/output data may increase. This increased reflection rate may mean that a level of data being actually transferred is lowered. It may be possible to control a width of a swing voltage level of input/output data or a control signal by controlling impedance (or, increasing a resistance value). Overshoot/undershoot may be remarkably reduced by controlling impedance.

The impedance control circuit 116 may include an on-die termination (ODT) circuit or an off-chip driver (OCD), for example. The ODT circuit may control impedance of a signal line connected to the pad. The ODT circuit may control impedance such that a termination resistance value is set to a predetermined impedance value. The OCD may be connected to an end of the output driver 112, and may control an alternating voltage of a differential signal to level a pull-up signal and a pull-down signal.

Data reliability may be improved by stabilizing a waveform of input/output data or a signal transferred via the pad by the impedance control circuit 116.

Figure 5:
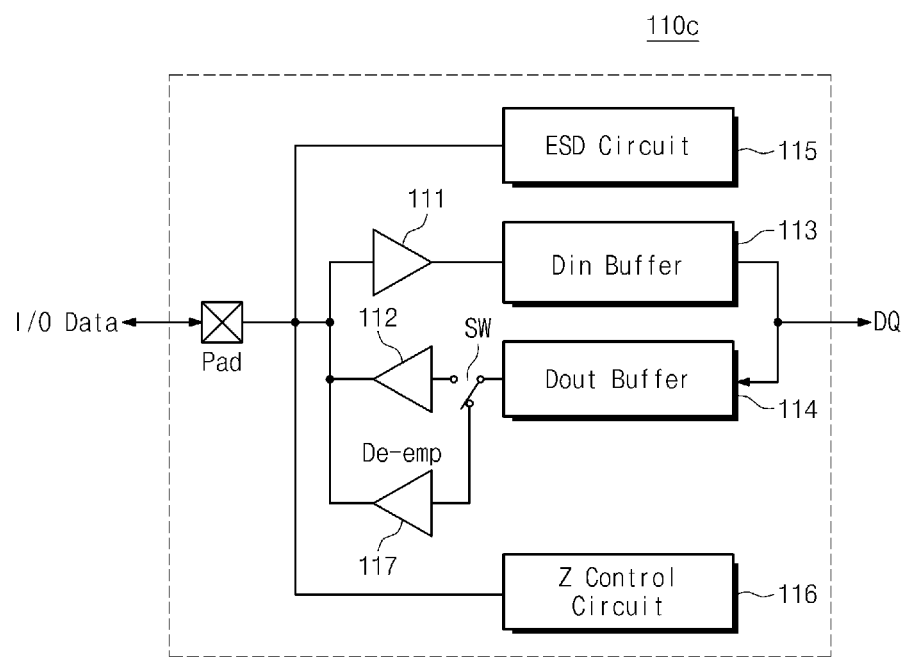
FIG. 5 is a block diagram schematically illustrating an input/output circuit chip according to still another exemplary embodiment.

FIG. 5 is a block diagram schematically illustrating an input/output circuit chip according to still another exemplary embodiment. Referring to FIG. 5, an input/output circuit chip 110c may include an input driver 111, an output driver 112, a data input (Din) buffer 113, a data output (Dout) buffer 114, an ESD circuit 115, an impedance control circuit (Z Control Circuit) 116, and a de-emphasis driver (de-emp) 117. Herein, the input driver 111, the output driver 112, the ESD circuit 115, the impedance control circuit 116, and the de-emphasis driver 117 may be electrically connected to a pad. The constituent elements 111, 112, 113, 114, 115, and 116 in FIG. 5 may be substantially identical to those in FIG. 4, and description thereof is thus omitted.

The de-emphasis driver 117 may be connected in parallel with the output driver 112. If a de-emphasis mode is activated, the output driver 112 and the de-emphasis driver 117 may be connected via a switch SW. In this case, data output from the data output buffer 114 may be modulated in a de-emphasis manner, and the modulated data may be output via the pad.

The de-emphasis driver 117 may be an output driver to which Pseudo-Open Drain (POD) signaling is applied. The de-emphasis driver 117 may modulate a bit stream provided from the data output buffer 114 to transfer the bit stream to the pad. For example, when a de-emphasis mode is activated, the de-emphasis driver 117 may amplify or attenuate a bit stream transferred from the data output buffer 114 and a delayed bit stream by different rates and may add resultant values. A DC component of data output to the pad may be minimized by the de-emphasis process. It may be possible to address a disadvantage associated with limitation of a channel bandwidth according to a waveform of data output according to the de-emphasis process. If a de-emphasis technique of stepwise increasing or decreasing a level is applied to a square wave, a high frequency may be considerably suppressed. Accordingly, limitation of a channel bandwidth may be overcome by using the de-emphasis driver 117. Further, if data is transferred using a multi-level signal being a 4 or more-level signal, the Inter-Symbol Interference (ISI) generated due to a high frequency may be reduced.

Figure 6:
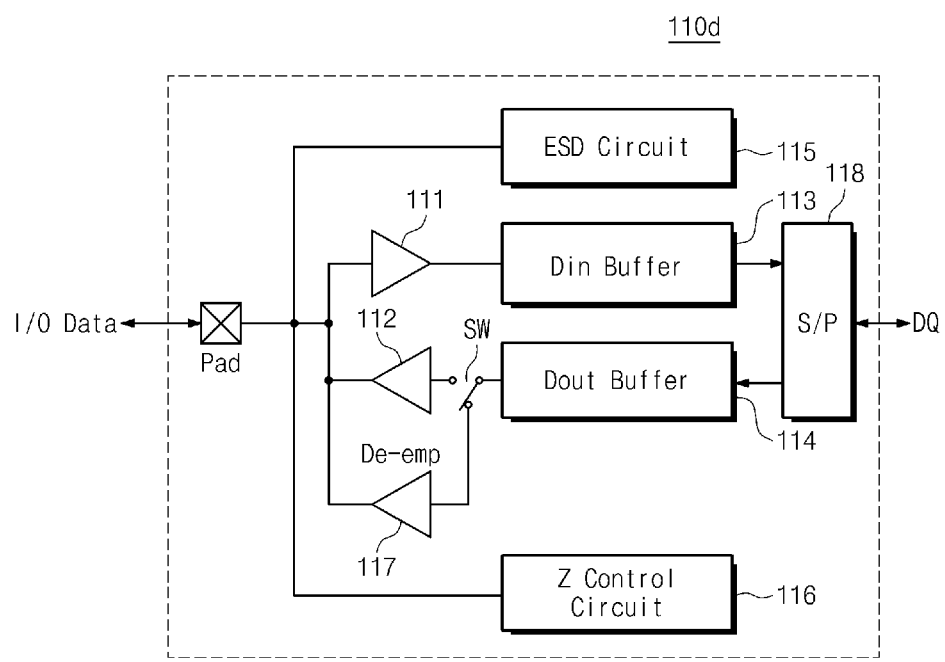
FIG. 6 is a block diagram schematically illustrating an input/output circuit chip according to still another exemplary embodiment.

FIG. 6 is a block diagram schematically illustrating an input/output circuit chip according to still another exemplary embodiment. Referring to FIG. 6, an input/output circuit chip 110d may include an input driver 111, an output driver 112, a data input (Din) buffer 113, a data output (Dout) buffer 114, an ESD circuit 115, an impedance (Z) control circuit 116, a de-emphasis driver 117, and a serial-to-parallel circuit (S/P) 118. Herein, the input driver 111, the output driver 112, the ESD circuit 115, the impedance control circuit 116, and the de-emphasis driver 117 may be electrically connected to a pad. The constituent elements 111, 112, 113, 114, 115, 116, and 117 in FIG. 6 may be substantially identical to those in FIG. 5, and description thereof is thus omitted.

The serial-to-parallel circuit 118 may be located at an output of the data input buffer 113 and an input of the data output buffer 114, and may convert a data stream input from a core chip 120 into serial data. The serial-to-parallel circuit 118 may convert serial data input from an external device into parallel data to send the converted data to the core chip 120.

Various functions and configurations had been described using input/output circuit chips 110a, 110b, 110c, and 110d in FIGS. 3 through 6. However, functions and configurations for improving the reliability of the input/output data can be further included within an input/output circuit chip. Further, various components for which it is difficult to reduce the minimum feature size (i.e., unscalable components) may be included in the input/output circuit chip.

Figure 7:
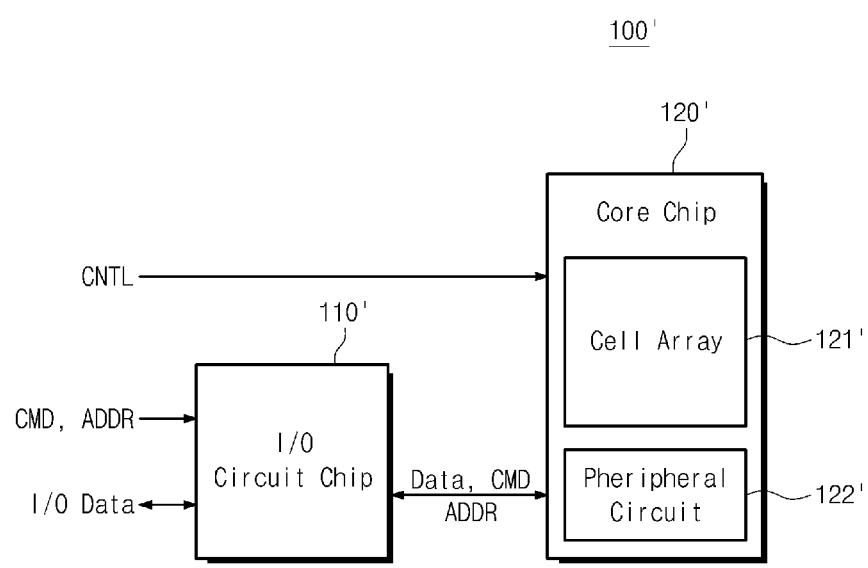
FIG. 7 is a block diagram schematically illustrating a memory device according to another exemplary embodiment.

FIG. 7 is a block diagram schematically illustrating a memory device according to another exemplary embodiment. Referring to FIG. 7, a memory device 100' may receive I/O data, an address ADDR, and a command CMD via an input/output circuit chip 110'. The memory device may be a non-volatile memory such as a flash memory device.

The input/output circuit chip 110' may receive a command CMD, an address ADDR, and data via a data input/output channel. For example, at a data write operation, the input/output circuit chip 110' may receive a write command CMD, an address ADDR, and write data. When the write command and the address are input, for example, control signals CTRL such as a write enable signal /WE and an address latch enable signal ALE may be input. The input address and write data may be transferred to a core chip 120' from the input/output circuit chip 110'. A peripheral circuit 122' of the core chip 120' may write the input write data at an area of a cell array 121' corresponding to the input address.

At a read operation, the input/output circuit chip 110' may receive a read command and an address provided from an external device via input/output pads. When the read command and the address are input, control signals CTRL such as a write enable signal/WE and an address latch enable signal ALE may be input. The input read command and address may be sent to the core chip 120' from the input/output circuit chip 110'. The peripheral circuit 122' of the core chip 120' may sense data from an appointed memory area to output the data to the input/output circuit chip 110'. The input/output circuit chip 110' may process the read-out data to output the read-out data to the external device.

Although a function of an input/output circuit chip 110 described in relation to FIG. 2 is different from a function of an input/output circuit chip 110' described in relation to FIG. 7, the inventive concept is not be limited to this disclosure. Various control signals and data can be exchanged with the external device using the input/output circuit chip 110 or the input/output circuit chip 110'.

Figure 8:
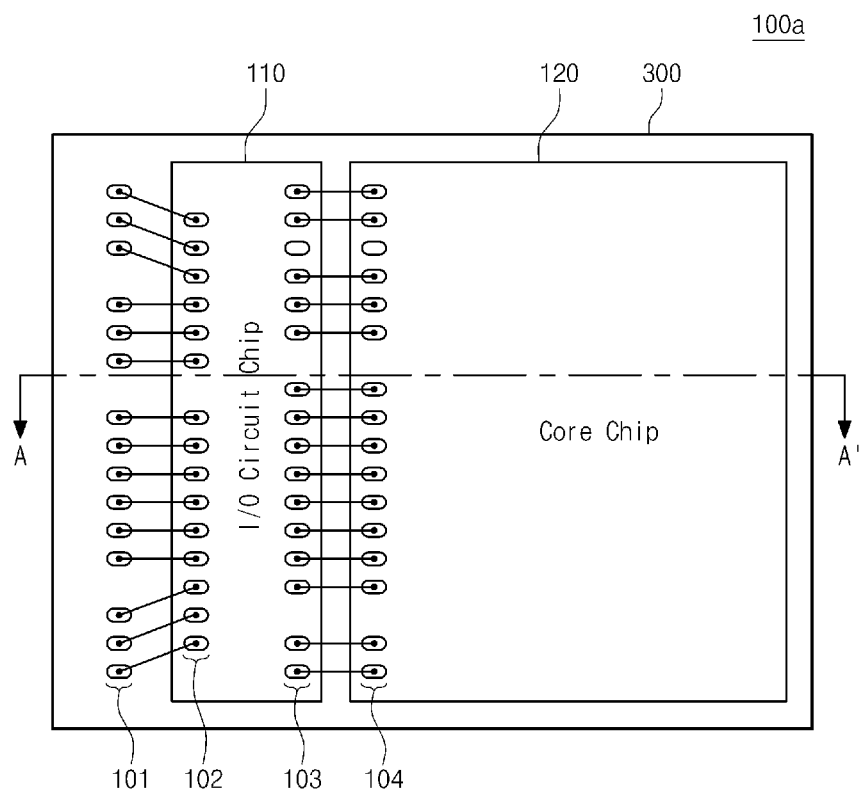
FIG. 8 is a top view of a memory device according to an exemplary embodiment.

FIG. 8 is a top view of a memory device according to an exemplary embodiment. A memory device 100a according to an exemplary embodiment may include an input/output circuit chip 110 and a core chip 120 mounted on a printed circuit board 300.

The input/output circuit chip 110 may be connected with pads 101 of the printed circuit board 300 for providing electrical connection with an external device via bonding wires. That is, the pads 101 of the printed circuit board 300 may be connected with pads 102 of the input/output circuit chip 110 via bonding wires.

The input/output circuit chip 110 and a core chip 120 may be electrically connected by wire bonding pads 103 and pads 104. The input/output circuit chip 110 may process data or signals transferred from the external device via the pads 102 to transfer the data or signals to the core chip 120 via the pads 103. The input/output circuit chip 110 may process output data or signals of the core chip 120 provided via the pads 103 to output the data or signals to the pads 102.

The input/output circuit chip 110 and the core chip 120 may be fabricated using processes to which different design rules are applied. For example, the input/output circuit chip 110 may be a semiconductor chip which is fabricated using a process such that the minimum feature size is 45 nm, and the core chip 120 may be a semiconductor chip which is fabricated using a process such that the minimum feature size is 25 nm. The memory chip 100a may be formed of a combination of the input/output circuit chip 110 and the core chip 120 which are fabricated using different design rules or fabrication processes. In this case, it may be easy to improve the integration of the core chip 120 including a memory element which is relatively easy to shrink the minimum feature size. On the other hand, it may be relatively difficult to shrink the minimum feature size of the input/output circuit chip 110 including a buffer, a driver, an ESD circuit, and the like. Accordingly, components for which it is difficult to shrink the minimum feature size may be formed at the input/output circuit chip 110, and components for which it is easy to shrink the minimum feature size may be formed at the core chip 120. In this case, it may be possible to rapidly cope with a trend of sharp shrinking of the minimum feature size.

Herein, there is described an example that the core chip 120 is formed of a single chip. The core chip 120 can be a volatile memory device. For example, the core chip 120 may include a volatile memory such as DRAM. Alternatively, the core chip 120 can include a NAND flash memory with a mass storage capacity. Still alternatively, the core chip 120 may be formed of a next-generation nonvolatile memory such as PRAM, MRAM, ReRAM, FRAM, or the like or a NOR flash memory. In addition, the core chip 120 may include a three-dimensional memory array formed of a single chip. For example, the core chip 120 may be formed of a vertical NAND in which cell strings are formed in a vertical direction to a substrate.

Figure 9:
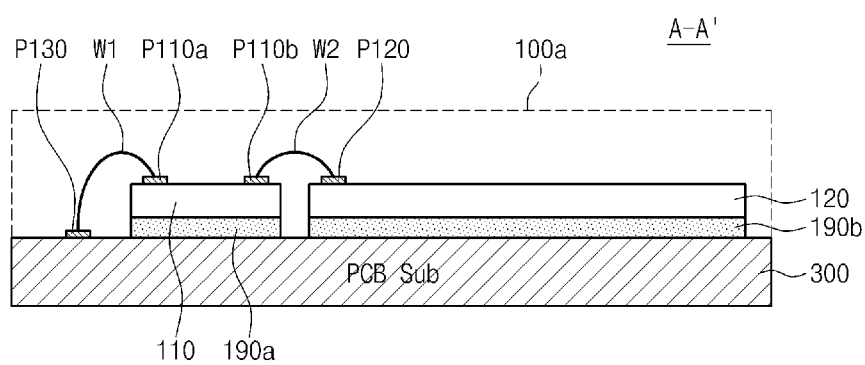
FIG. 9 is a cross-sectional view taken along a line A-A' in FIG. 8.

FIG. 9 is a cross-sectional view taken along a line A-A' in FIG. 8. Referring to FIG. 9, a PCB substrate 300, an input/output circuit chip 110, and a core chip 120 may be included to constitute a memory device 100a. Pads P110a, P110b, P120, and P130, and bonding wires W1 and W2 may be formed to electrically connect the input/output circuit chip 110, the core chip 120, and the PCB substrate 300.

The input/output circuit chip 110 and the core chip 120 may be mounted on the PCB substrate 300 to form the memory device 110a. An adhesive layer 190a may be interposed between the input/output circuit chip 110 and the PCB substrate 300, and an adhesive layer 190b may be interposed between the core chip 120 and the PCB substrate 300. The pad P120 formed at the core chip 120 may be connected to the pad P110b formed at the input/output circuit chip 110 via the bonding wire W2. The pad 110a formed at the input/output circuit chip 110 may be connected to the pad P130 of the PCB substrate 300 via the bonding wire W1.

Herein, the input/output circuit chip 110 and the core chip 120 may be fabricated using the same design rule or different design rules.

Figure 10:
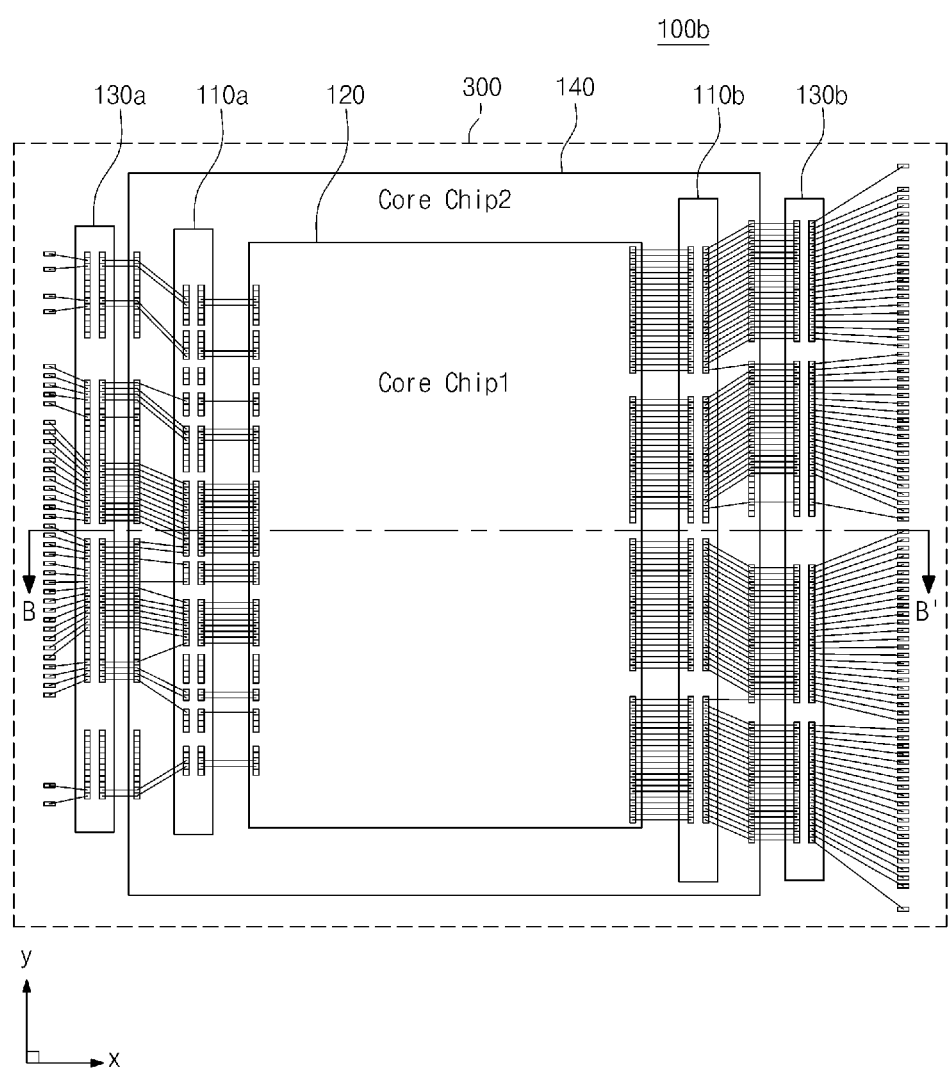
FIG. 10 is a top view schematically illustrating a layout of a memory device according to another exemplary embodiment.

FIG. 10 is a top view schematically illustrating a layout of a memory device according to another exemplary embodiment. Referring to FIG. 10, two core chips, i.e., core chip1 120 and core chip2 140, having different sizes may be stacked on a PCB substrate 300. Input/output circuit chips 110a, 110b, 130a, and 130b may be located on the PCB substrate 300 and the core chip2 140 so as to correspond to the core chips 120 and 140, respectively. This will be more fully described below.

The core chip2 140 and the input/output circuit chips 130a and 130b may be mounted on the PCB substrate 300. The core chip1 120 and the input/output circuit chips 110a and 110b may be stacked on the core chip2 140. In FIG. 10, there may be illustrated the case that chip pads are formed at two opposite sides of each of the core chips 120 and 140. However, the inventive concept is not be limited thereto. For example, chip pads can be formed at one side or on all four sides, or on any combination of sides.

The input/output circuit chips 110a and 110b for providing data or signals to the core chip 1 120 may be electrically connected to chip pads of the core chip 1 120 via bonding wires. Bonding wires drawn out from each of the input/output circuit chips 110a and 110b may be connected to chip pads of the core chip2 140. Herein, layouts or sizes of the input/output circuit chips 110a and 110b can be different.

Further, chip pads of the core chip2 140 may be connected to the input/output circuit chips 130a and 130b via bonding wires. Bonding wires connected to the input/output circuit chips 130a and 130b may be connected to pads formed on the PCB substrate 300. The pads formed on the PCB substrate 300 may be electrically connected to data and signal lines outside the memory device 100b.

Unlike in the illustration, in the event that a multi-chip memory device is implemented by stacking related art chip dies without separating core chips and input/output circuit chips, it may be difficult or impossible to make a stack process. That is, it may be difficult to connect chip pads of related art stacked chips and an external device using bonding wires. In this case, bonding wires can be connected by applying a wiring rearranging process to at least one chip. Alternatively, although products are assembled under a defect risk, it may be difficult to escape a sharp lowering of a yield.

But, with an exemplary embodiment, chips can be stacked without a wiring rearranging process by separating the input/output circuit chips 110a and 110b and the core chip1 120 and the input/output circuit chips 130a and 130b and the core chip2 140. Further, lengths of bonding wires may become shorter according to locations of the input/output circuit chips 110a and 110b. This may mean that a yield is improved relatively.

Figure 11:
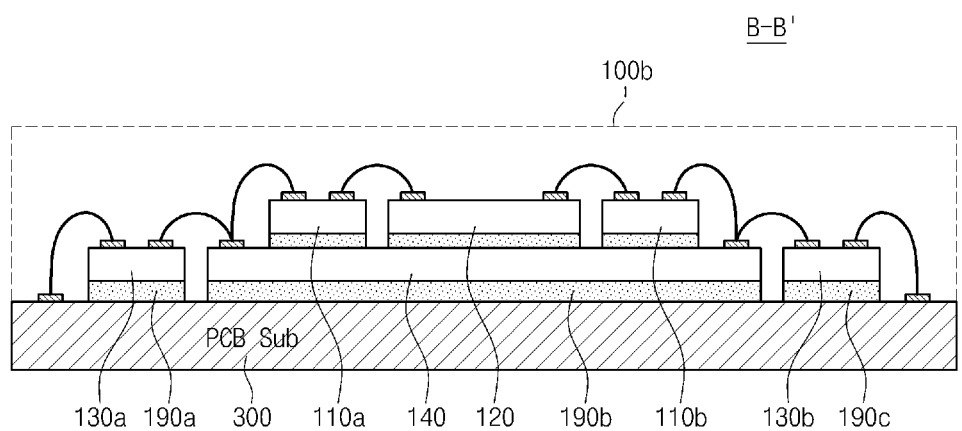
FIG. 11 is a cross-sectional view taken along a line B-B' in FIG. 10.

FIG. 11 is a cross-sectional view taken along a line B-B' in FIG. 10. Referring to FIG. 11, a memory device 100b may include a PCB substrate 300, input/output circuit chips 110a and 110b, a first core chip 120, input/output circuit chips 130a and 130b, and a second core chip 140.

The second core chip 140 and the input/output circuit chips 130a and 130b may be located on a PCB substrate 300 to constitute the memory device 100b. Pads on the PCB substrate 300 may be coupled with the second core chip 140 via the input/output circuit chips 130a and 130b. An adhesive layer 190b may be provided between the PCB substrate 300 and the second core chip 140, and adhesive layer 190a and 190c may be provided between the PCB substrate 300 and the input/output circuit chip 130a and between the PCB substrate 300 and the input/output circuit chip 130b, respectively.

The first core chip 120 and the input/output circuit chips 110a and 110b may be stacked on the second core chip 140. The first core chip 120 and the input/output circuit chips 110a and 110b may be electrically connected via bonding wires. Pads of each of the input/output circuit chips 110a and 110b may be electrically connected with pads located at the second core chip 140. With this configuration, it may be free to implement various combinations of multi-chip memory devices regardless of sizes of the first core chip 120 and the second core chip 140. Further, a wiring rearranging process for routing onto the second core chip 140 may be avoided by using the input/output circuit chips 110a and 110b, regardless of a chip combination.

Figure 12:
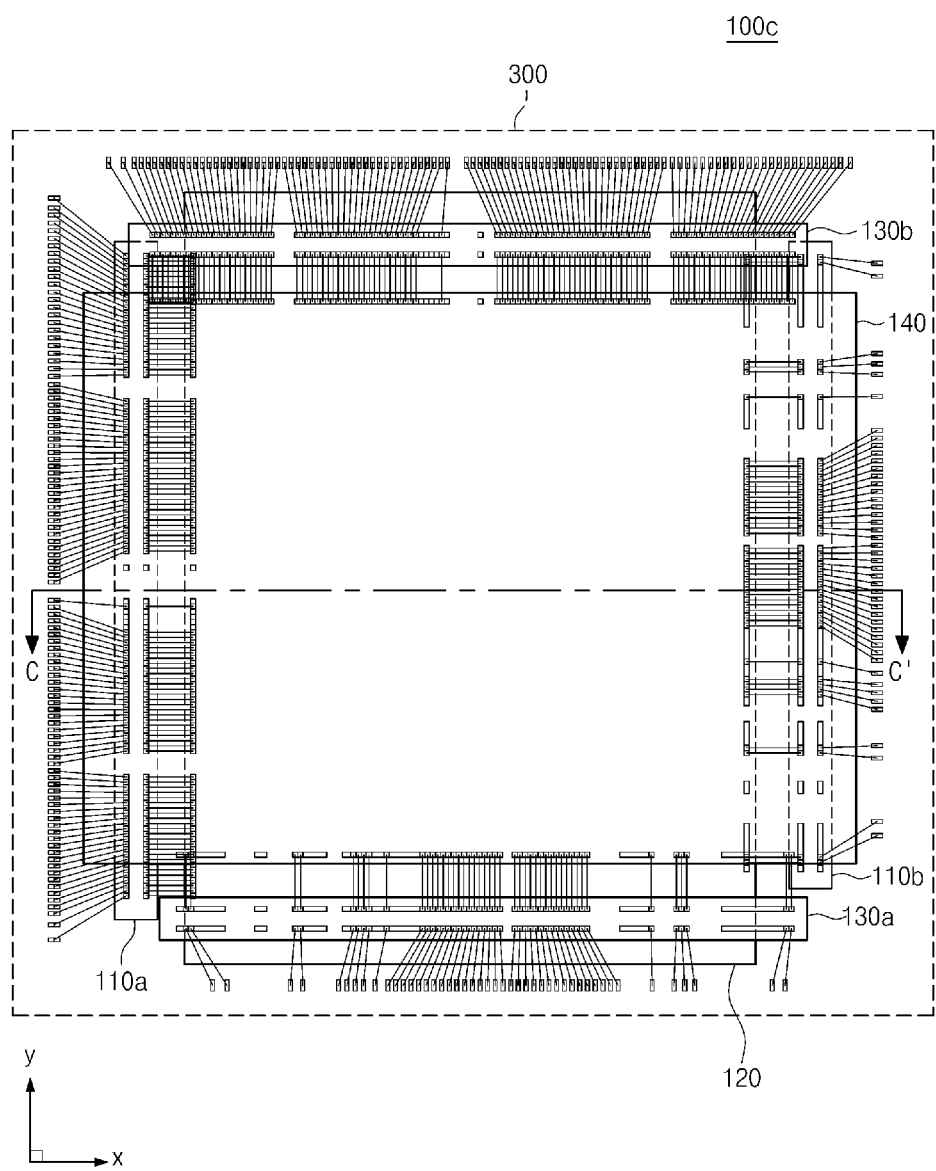
FIG. 12 is a top view illustrating a layout of a memory device according to still another exemplary embodiment.

FIG. 12 is a top view illustrating a layout of a memory device according to still another exemplary embodiment. Referring to FIG. 12, core chips 120 and 140 having the same or similar size may be stacked on a PCB substrate 300 to form a memory device 100c. Input/output chips 110a and 110b corresponding to the core chip 120 and input/output chips 130a and 130b corresponding to the core chip 140 may be placed at the top of the PCB substrate 300.

The first core chip 120 and the input/output chips 110a and 110b may be mounted at the top of the PCB substrate 300. The input/output chips 130a and 130b connected with the second core chip 140 may be mounted at the top of the PCB substrate 300 so as to be rotated by 90 degrees with respect to the input/output chips 110a and 110b. The second core chip 140 may be stacked at the top of the first core chip 120 and the input/output chips 110a and 110b. Herein, the second core chip 140 may be a semiconductor device of the same kind or a semiconductor device having a similar size. As a result, the second core chip 140 may be placed at the top of the first core chip 120 and the input/output circuit chips 110a and 110b, and may be physically supported by the first core chip 120 and the input/output circuit chips 110a and 110b.

In the above-described stack structure, chip pads of the first core chip 120 may be wire bonded with chip pads of the input/output circuit chips 110a and 110b. The chip pads of the input/output circuit chips 110a and 110b may be wire bonded with pads formed on the PCB substrate 300. An adhesive layer may be formed at the top of the first core chip 120 and the input/output circuit chips 110a and 110b, and the second core chip 140 may be stacked on a resultant structure. Chip pads of the second core chip 140 may be wire bonded with chip pads of the input/output circuit chips 130a and 130b which are not stacked.

The layout is described using the core chip 120 and the core chip 140 in which chip pads are located at two edges. However, the inventive concept may be applied to core chips in which chip pads are located at only one edge. The stacked second core chip 140 having a rectangular shape may be supported by the first core chip 120 and the input/output circuit chips 110a and 110b may be are placed under the second core chip 140. Accordingly, disadvantages due to over-hang may be addressed at a fabrication process in which a physical power is forced to an edge.

Figure 13:
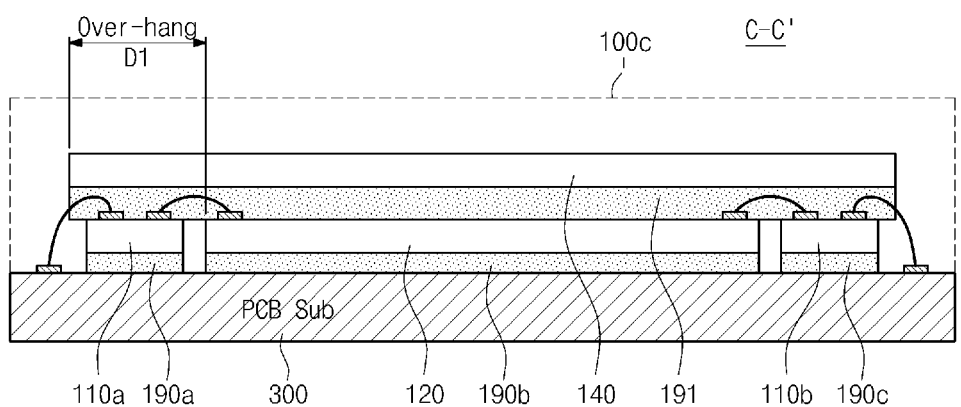
FIG. 13 is a cross-sectional view taken along a line C-C' of FIG. 12.

FIG. 13 is a cross-sectional view taken along a line C-C' of FIG. 12. Referring to FIG. 13, a memory device 100c may include a PCB substrate 300, input/output circuit chips 110a and 110b, a first core chip 120, input/output circuit chips 130a and 130b, and a second core chip 140.

The first core chip 120 and the input/output circuit chips 110a and 110b may be placed over the PCB substrate 300 to form the memory device 100c. Although not shown in FIG. 13, the input/output circuit chips 130a and 130b may be placed over the PCB substrate 300. Chip pads of the first core chip 120 may be wire bonded to chip pads of the input/output circuit chips 110a and 110b. The chip pads of the input/output circuit chips 110a and 110b may be wire bonded with pads placed on the PCB substrate 300 for interconnection with the outside. An adhesive layer 190b may be provided between the PCB substrate 300 and the first core chip 120, and adhesive layers 190a and 190c may be placed between the PCB substrate 300 and the input/output circuit chip 110a and between the PCB substrate 300 and the input/output circuit chip 110b, respectively.

An adhesive layer may be formed between a structure, formed of the first core chip 120 and the input/output circuit chips 110a and 110b, and the second core chip 140. The second core chip 140 may be stacked on the adhesive layer 191. Although not shown in FIG. 13, chip pads of the input/output circuit chips 130a and 130b and the second core chip 140 placed over the PCB substrate 300 may be wire bonded. The chip pads of the input/output circuit chips 130a and 130b may be wire bonded with pads formed on the PCB substrate 300. This connection may be made at the front or rear of FIG. 13. For this reason, such a structure is not illustrated in FIG. 13.

As illustrated in FIG. 13, over-hang may exist at the second core chip 140 of a rectangular shape stacked over the first core chip 120. That is, when chips having different aspect ratios are stacked so as to be dislocated, a lower side of a part of a chip may not be supported. Herein, a distance D1 may be referred to as the over-hang. The over-hang may be pressed at a process where a wire is connected with a chip pad. The over-hang may be warped or damaged due to iterative pressure. This may cause contact failure of a bonding wire connected to a chip pad of the second chip 140. The longer the distance D1 of the over-hang, the more the contact failure of the bonding wire.

However, if the input/output circuit chips 110a and 110b are separated according to an exemplary embodiment, the over-hang of the second core chip 140 may be supported by the input/output circuit chips 110a and 110b. Accordingly, warping or damage of an over-hang portion is remarkably reduced. Further, various sizes of over-hangs may be supported flexibly regardless of a chip size by adjusting locations of the input/output circuit chips 110a and 110b.

Figure 14:
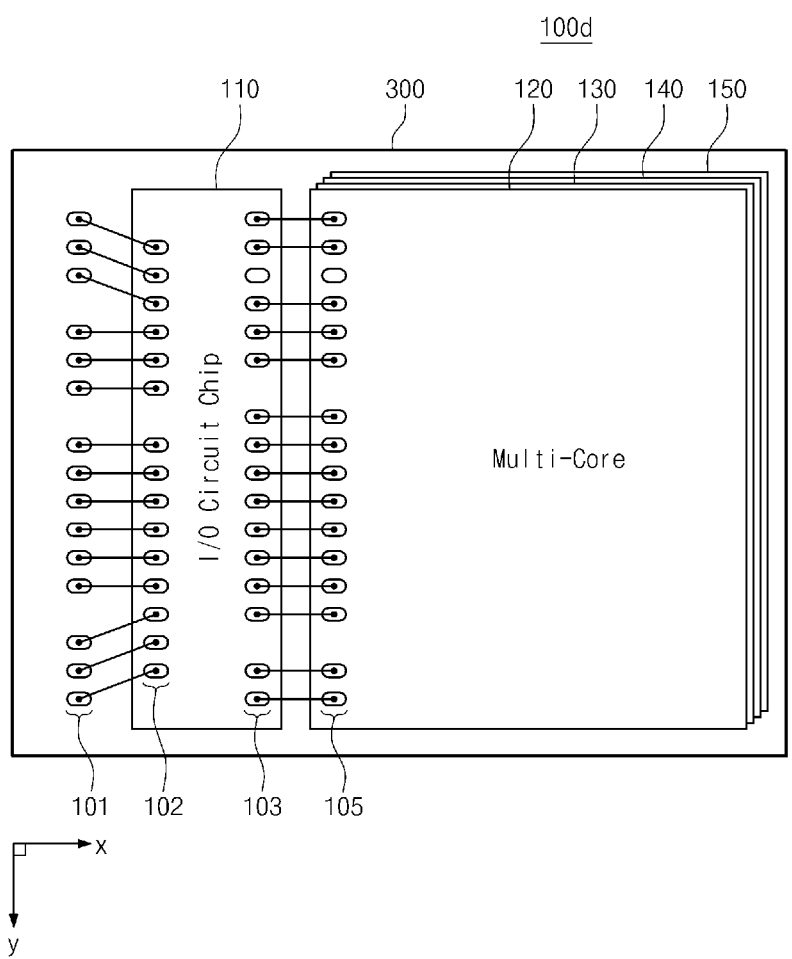
FIG. 14 is a top view of a memory device according to still another exemplary embodiment.

FIG. 14 is a top view of a memory device according to still another exemplary embodiment. Referring to FIG. 14, a memory device 100d may include an input/output circuit chip 110 and a plurality of stacked core chips which are stacked into a multi-core and are mounted at a PCB substrate 300. In FIG. 14, the multi-core is shown as having four core chips 120, 130, 140, 150. However, the inventive concept is not limited to this, and more or fewer core chips may be provided in the multi-core.

The input/output circuit chip 110 may be wire bonded with pads 101 on the PCB substrate 300. That is, pads 102 of the input/output circuit chip 110 may be wire bonded with the pads 101 of the PCB substrate 300.

The input/output circuit chip 110 and the plurality of core chips 120, 130, 140, 150 may be electrically connected with bonding wire connected between pads 103 and pads 105. The input/output circuit chip 110 may process data or signals transferred via the pads 102 from the outside to transfer the data or signals to the plurality of core chips 120, 130, 140, 150 via the pads 103. The input/output circuit chip 110 may process output data or signals of the plurality of core chips 120 sent via the pads 103 to output the data or signals to the pads 102.

The input/output circuit chip 110 and the plurality of core chips 120, 130, 140, 150 may be fabricated using different design rules. For example, the input/output circuit chip 110 may be a semiconductor chip which is fabricated using a process such that the minimum feature size is 45 nm, and the core chip 120 may be a semiconductor chip which is fabricated using a process such that the minimum feature size is 25 nm. The memory chip 100d may be formed of a combination of the input/output circuit chip 110 and the core chips 120, 130, 140, 150 which are fabricated using different design rules or fabrication processes. In this case, it may be easy to improve the integration of the core chips 120, 130, 140, 150 including a memory element for which it is relatively easy to shrink the minimum feature size. On the other hand, it may be relatively difficult to shrink the minimum feature size of the input/output circuit chip 110 including a buffer, a driver, an ESD circuit, and the like. Accordingly, components for which it is difficult to shrink the minimum feature size may be formed at the input/output circuit chip 110, and components for which it is easy to shrink the minimum feature size may be formed at the core chips 120, 130, 140, 150. In this case, it may be possible to rapidly cope with a trend of sharp shrinking of the minimum feature size.

Herein, the plurality of core chips 120, 130, 140, 150 can be a volatile memory device. For example, the plurality of core chips 120, 130, 140, 150 may include a volatile memory such as DRAM. Alternatively, the plurality of core chips 120, 130, 140, 150 can include a NAND flash memory with a mass storage capacity. Still alternatively, the plurality of core chips 120, 130, 140, 150 may be formed of a next-generation nonvolatile memory such as PRAM, MRAM, ReRAM, FRAM, or the like or a NOR flash memory. In addition, the plurality of core chips 120, 130, 140, 150 may include a three-dimensional memory array formed of a single chip. For example, each of the plurality of core chips 120, 130, 140, 150 may be formed of a vertical NAND in which cell strings are formed in a vertical direction to a substrate.

Figure 15:
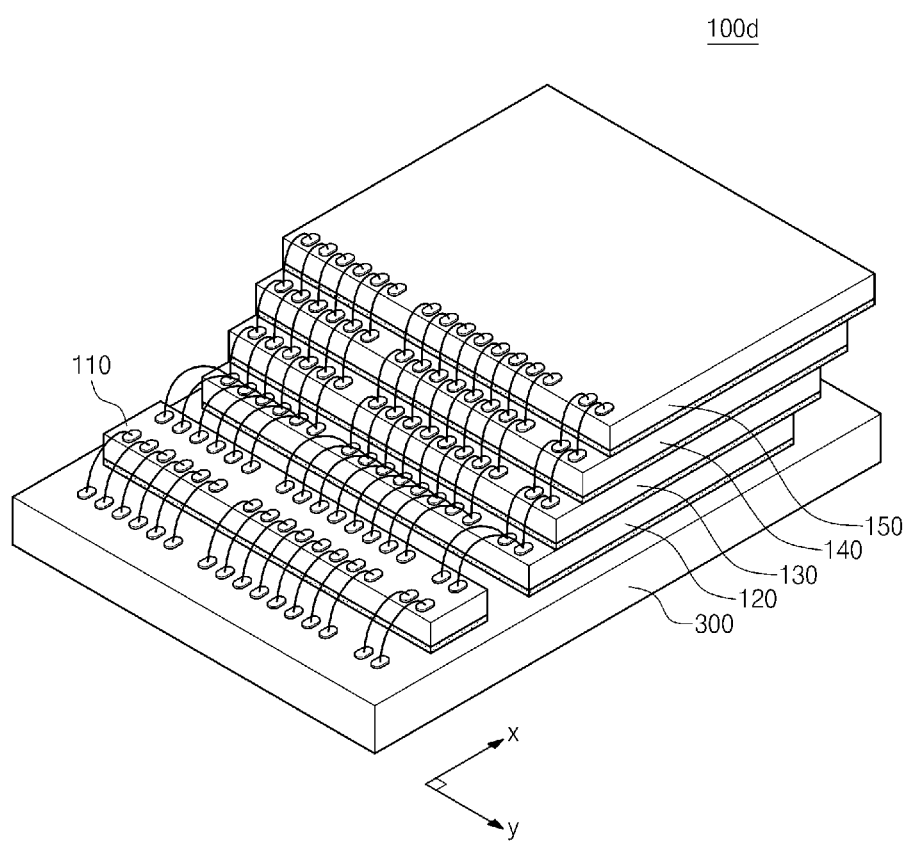
FIG. 15 is a perspective view of a memory device illustrated in FIG. 14.

FIG. 15 is a perspective view of a memory device illustrated in FIG. 14. Referring to FIG. 15, a PCB substrate 300, an input/output circuit chip 110, and a plurality of core chips 120, 130, 140, and 150 may be mounted to form a semiconductor device 100d.

The input/output circuit chip 110 and the core chip 120 may be mounted on the PCB substrate 300 to form the memory device 100d. The core chip 130 may be stacked on the core chip 120, the core chip 140 on the core chip 130, and the core chip 150 on the core chip 140. Herein, there is illustrated the case that the memory device 100d includes four stacked core chips 120 through 150. However, the inventive concept is not limited thereto. Adhesive layers may be provided among the core chips 120 through 150.

In the above structure, the input/output circuit chip 110 may be shared by the core chips 120 through 150. That is, the core chips 120 through 150 may exchange input/output data with an external device via the input/output circuit chip 110.

Figure 16:
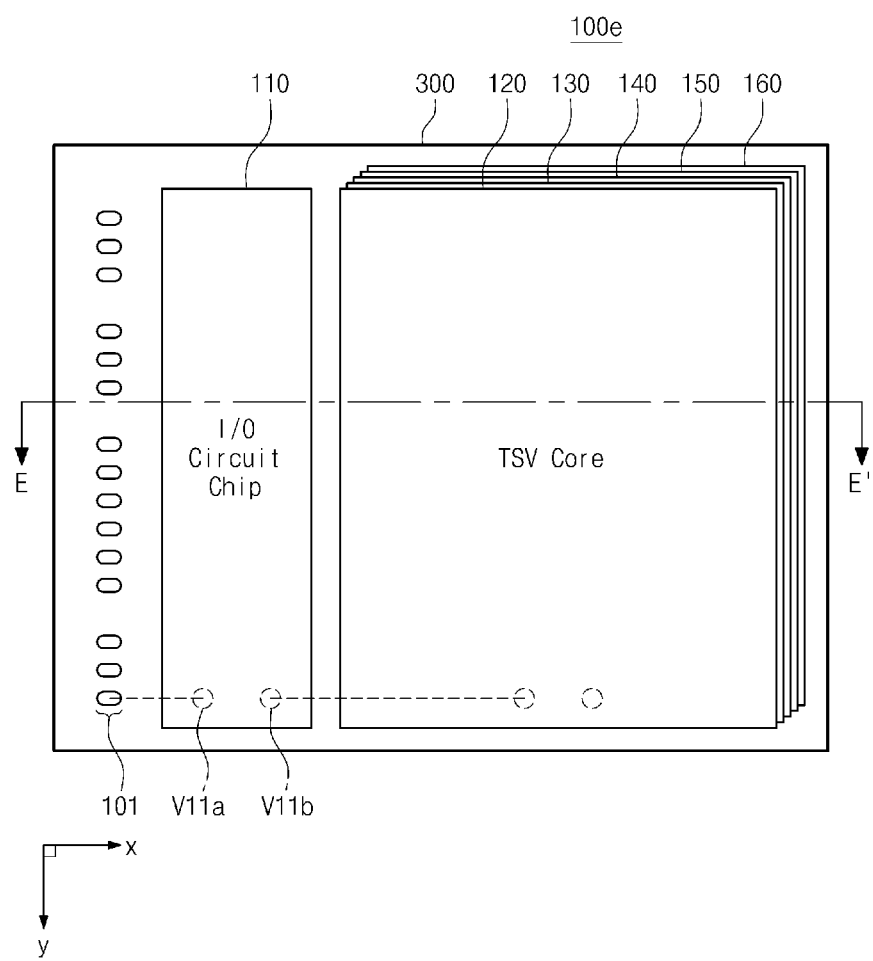
FIG. 16 is a top view of a memory device according to still another exemplary embodiment.

FIG. 16 is a top view of a memory device according to still another exemplary embodiment. Referring to FIG. 16, a memory device 100e may include an input/output circuit chip 110 and a plurality of stacked core chips 120 through 160 mounted on a PCB substrate 300. Herein, the stacked core chips 120 through 160 may be interconnected via Through Silicon Vias (TSVs).

The input/output circuit chip 110 may be electrically connected with pads 101 on the PCB substrate 300. However, a via V11a of the input/output circuit chip 110 may be connected with the pads 101 on the PCB substrate 300 using a circuit pattern or a buried circuit formed at the PCB substrate 300, rather than a bonding wire. The via V11a of the input/output circuit chip 110 may be connected with a via V12a of the core chips 120 through 160 via a circuit pattern or a buried circuit formed at the PCB substrate 300.

The input/output circuit chip 110 and the plurality of core chips 120 through 160 may be fabricated using different design rules. For example, the input/output circuit chip 110 may be a semiconductor chip which is fabricated using a process such that the minimum feature size is 45 nm, and the stacked core chips 120 through 160 may be semiconductor chips which are fabricated using a process such that the minimum feature size is 25 nm. The memory chip 100e may be formed of a combination of the input/output circuit chip 110 and the stacked core chips 120 through 160 which are fabricated using different design rules or fabrication processes. In this case, it may be easy to improve the integration of the stacked core chips 120 through 160 including a memory element for which it is relatively easy to shrink the minimum feature size. On the other hand, it may be relatively difficult to shrink the minimum feature size of the input/output circuit chip 110 including a buffer, a driver, an ESD circuit, and the like. Accordingly, components for which it is difficult to shrink the minimum feature size may be formed at the input/output circuit chip 110, and components for which it is easy to shrink the minimum feature size may be formed at the stacked core chips 120 through 160. In this case, it may be possible to rapidly cope with a trend of sharp shrinking of the minimum feature size.

Herein, the stacked core chips 120 through 160 can be a volatile memory device. For example, the stacked core chips 120 through 160 may include a volatile memory such as DRAM. Alternatively, the stacked core chips 120 through 160 can include a NAND flash memory with a mass storage capacity. Still alternatively, the plurality of core chips 120 may be formed of a next-generation nonvolatile memory such as PRAM, MRAM, ReRAM, FRAM, or the like or a NOR flash memory. In addition, the stacked core chips 120 through 160 may include a three-dimensional memory array formed of a single chip. For example, each of the stacked core chips 120 through 160 may be formed of a vertical NAND in which cell strings are formed in a vertical direction to a substrate.

Figure 17:
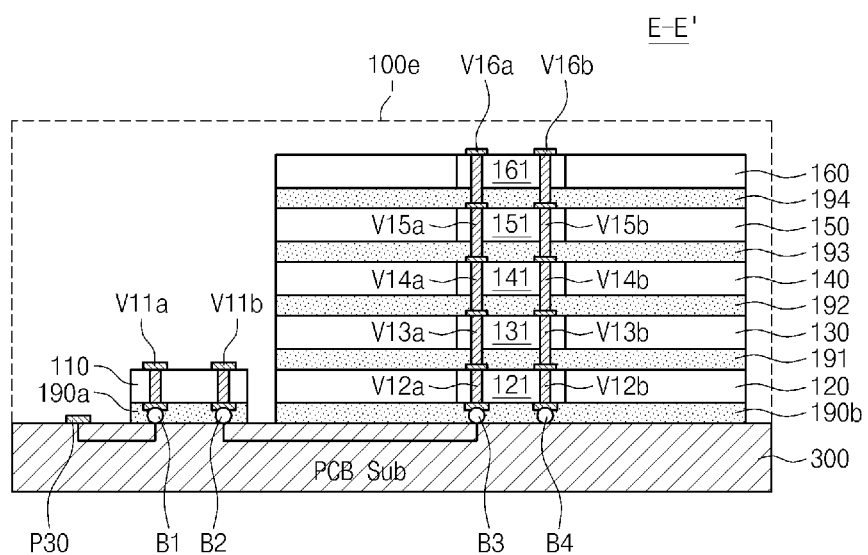
FIG. 17 is a cross-sectional view taken along a line E-E' of FIG. 16.

FIG. 17 is a cross-sectional view taken along a line E-E' of FIG. 16. Referring to FIG. 17, a memory device 100e may include a PCB substrate 300, an input/output circuit chip 110, and a plurality of stacked core chips 120 through 160.

The input/output circuit chip 110 may include a plurality of vias V11a and V11b which are formed by a TSV manner. The input/output circuit chip 110 may be fixed at the PCB substrate 300 by external terminals B1 and B2 which are formed at a lower surface of the input/output circuit chip 110. The via V11a may be connected with a pad P30, connected with an external device of the memory device 100e, via the external terminal B1 and a circuit of the PCB substrate 300. Herein, the circuit of the PCB substrate 300 may be a metal pattern formed on the substrate 300 or a circuit wiring buried at the substrate 300. The input/output circuit chip 110 may exchange data or signals with an external device through the via V11a.

The input/output circuit chip 110 may be connected with the core chips 120 through 160 through the via V11b, the external terminal B2, and a circuit of the PCB substrate 300. The core chip 120 placed at the lowermost layer may include a chip region 121 for forming a via. Conductive vias V12a and V12b penetrating the chip region 121 may be electrically connected with the input/output circuit chip 110 via external terminals B3 and B4. Herein, the external terminals B1, B2, B3, and B4 may be formed of, for example, a solder ball, respectively.

A through structure of the first core chip 120 may be identically applied to second through fifth core chips 130 through 160. Vias V13a and V13b may be formed at a chip region 131 of the second core chip 130. The vias V13a and V13b may be aligned with the vias V12a and V12b. Vias V14a and V14b may be formed at a chip region 141 of the third core chip 140. The vias V14a and V14b may be aligned with the vias V13a and V13b. Vias V15a and V15b may be formed at a chip region 151 of the fourth core chip 150. The vias V15a and V15b may be aligned with the vias V14a and V14b. Vias V16a and V16b may be formed at a chip region 161 of the fifth core chip 160. The vias V16a and V16b may be aligned with the vias V15a and V15b. As illustrated in FIG. 17, adhesive layers 190a, 190b, 191, 192, 193, and 194 may be provided between the PCB substrate 300 and the core chip 120 and among the core chips 120 through 160.

If core chips are stacked using the TSV technique to form a stack-type multi-chip, a wiring distance may be remarkably reduced as compared with a wiring bonding manner. Thus, it is possible to easily implement high-speed, low-power, and small-sized elements.

Figure 18:
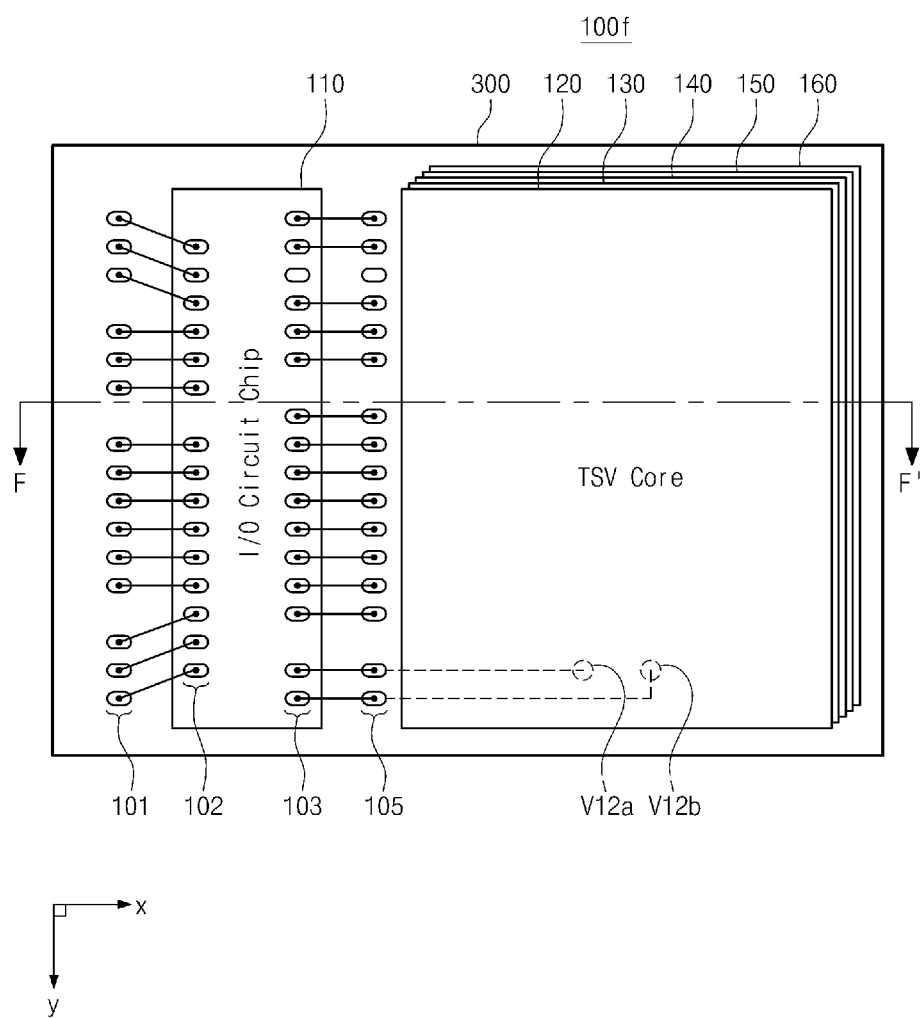
FIG. 18 is a top view of a memory device according to still another exemplary embodiment.

FIG. 18 is a top view of a memory device according to still another exemplary embodiment. Referring to FIG. 18, a memory device 100f may include an input/output circuit chip 110 and a plurality of stacked core chips 120 through 160 mounted on a PCB substrate 300. Herein, the stacked core chips 120 through 160 may be interconnected via Through Silicon Vias (TSVs).

The input/output circuit chip 110 may be electrically connected with pads 101 on the PCB substrate 300 to provide electrical connection with an external device. Chip pads 102 of the input/output circuit chip 110 may be wire bonded to pads 101 on the PCB substrate 300. Chip pads 103 of the input/output circuit chip 110 may be wire bonded to pads 105 formed on the PCB substrate 300. The pads 105 on the PCB substrate 300 may be electrically connected with vias V12a and V12b of the core chips 120 through 160 using a circuit pattern or a buried circuit formed at the PCB substrate 300.

Figure 19:
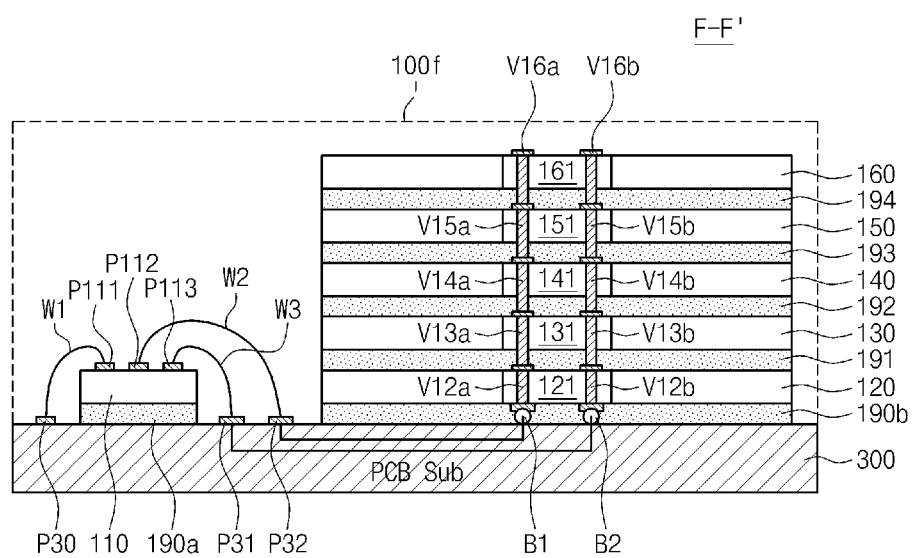
FIG. 19 is a cross-sectional view taken along a line F-F' of FIG. 18.

FIG. 19 is a cross-sectional view taken along a line F-F' of FIG. 18. Referring to FIG. 19, a memory device 100f may include a PCB substrate 300, an input/output circuit chip 110, and a plurality of stacked core chips 120 through 160.

A chip pad P111 of the input/output circuit chip 110 may be connected with a pad P30 on the PCB substrate 300 via a bonding wire W1. Pads P112 and P113 formed on the input/output circuit chip 110 may be connected with pads P31 and P32 formed on the PCB substrate 300 via bonding wires W2 and W3, respectively. The pads P31 and P32 may be connected to the core chips 120 through 160 via a circuit pattern of the PCB substrate 300. The first core chip 120 placed at the lowermost layer may include a chip region 121 for forming a through via. Vias V12a and V12b penetrating the chip region 121 may be electrically connected with the input/output circuit chip 110 via external terminals B1 and B2. Herein, the external terminals B1 and B2 may be formed of, for example, a solder ball.

A through structure of the first core chip 120 may be identically applied to second through fifth core chips 130 through 160. Vias V13a and V13b may be formed at a chip region 131 of the second core chip 130. The vias V13a and V13b may be aligned with the vias V12a and V12b. Vias V14a and V14b may be formed at a chip region 141 of the third core chip 140. The vias V14a and V14b may be aligned with the vias V13a and V13b. Vias V15a and V15b may be formed at a chip region 151 of the fourth core chip 150. The vias V15a and V15b may be aligned with the vias V14a and V14b. Vias V16a and V16b may be formed at a chip region 161 of the fifth core chip 160. The vias V16a and V16b may be aligned with the vias V15a and V15b. As illustrated in FIG. 19, adhesive layers 190a, 190b, 191, 192, 193, and 194 may be provided between the PCB substrate 300 and the core chip 120 and among the core chips 120 through 160.

If core chips are stacked using the TSV technique to form a stack-type multi-chip, a wiring distance may be remarkably reduced as compared with a wire bonding manner. Thus, it is possible to easily implement high-speed, low-power, and small-sized elements.

The input/output circuit chip 110 and the plurality of core chips 120 through 160 may be fabricated using different design rules. For example, the input/output circuit chip 110 may be a semiconductor chip which is fabricated using a process that the minimum feature size is 45 nm, and the core chips 120 through 160 may be a semiconductor chip which is fabricated using a process that the minimum feature size is 25 nm. The memory chip 100d may be formed of a combination of the input/output circuit chip 110 and the core chips 120 through 160 which are fabricated using different design rules or fabrication processes. In this case, it may be easy to improve the integration of the core chips 120 through 160 including a memory element for which it is relatively easy to shrink the minimum feature size. On the other hand, it may be relatively difficult to shrink the minimum feature size of the input/output circuit chip 110 including a buffer, a driver, an ESD circuit, and the like. Accordingly, components for which it is difficult to shrink the minimum feature size may be formed at the input/output circuit chip 110, and components for which it is easy to shrink the minimum feature size may be formed at the core chips 120 through 160. In this case, it may be possible to rapidly cope with a trend of sharp shrinking of the minimum feature size. Further, data and signal exchange of the core chips 120 through 160 may be made using one input/output circuit chip 110.

Herein, the plurality of core chips 120 through 160 can be a volatile memory device. For example, the plurality of core chips 120 may include a volatile memory such as DRAM. Alternatively, the plurality of core chips 120 through 160 can include a NAND flash memory with a mass storage capacity. Still alternatively, the plurality of core chips 120 through 160 may be formed of a next-generation nonvolatile memory such as PRAM, MRAM, ReRAM, FRAM, or the like or a NOR flash memory. In addition, the plurality of core chips 120 through 160 may include a three-dimensional memory array formed of a single chip. For example, each of the plurality of core chips 120 through 160 may be formed of a vertical NAND in which cell strings are formed in a vertical direction to a substrate.

Figure 20:
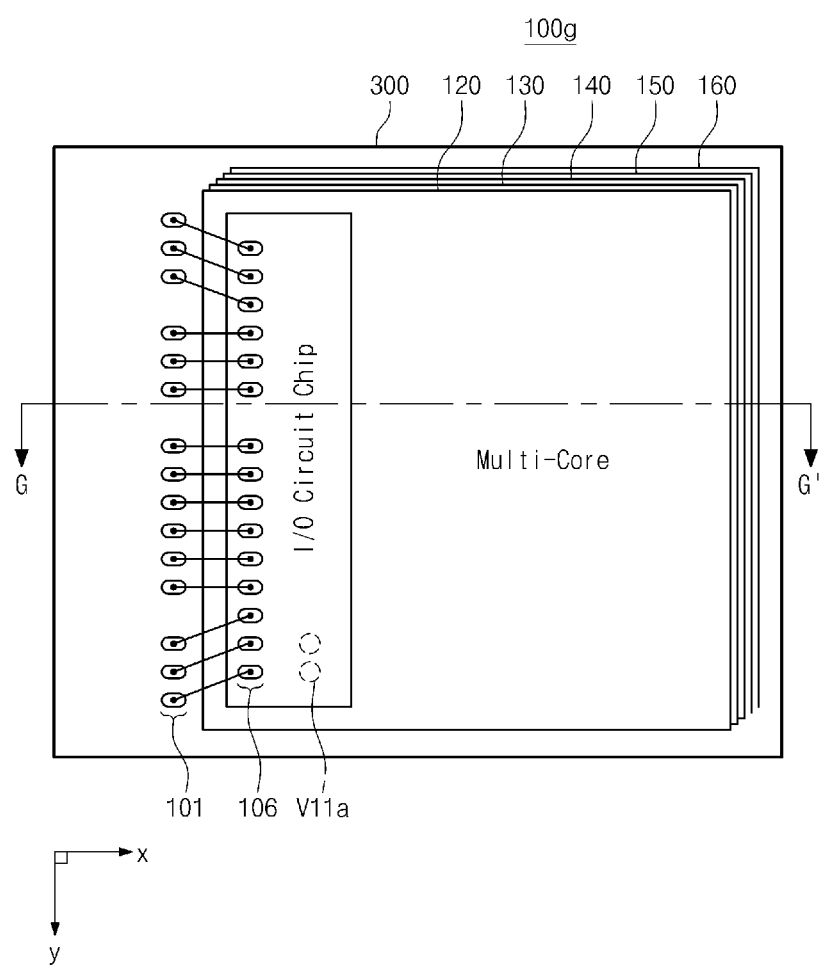
FIG. 20 is a top view of a memory device according to still another exemplary embodiment.

FIG. 20 is a top view of a memory device according to still another exemplary embodiment. Referring to FIG. 20, a memory device 100g may include a plurality of core chips 120 through 160 stacked on a PCB substrate 300 and an input/output circuit chip 110 stacked on the uppermost layer of the stacked core chips 120 through 160 (or, on a structure of the stacked core chips). Herein, the input/output circuit chip 110 and the stacked core chips 120 through 160 may be interconnected via Through Silicon Vias (TSVs).

The input/output circuit chip 110 may be stacked on a structure of the plurality of stacked core chips 120 through 160 (or, on the uppermost layer of the stacked core chips). Chip pads 106 of the input/output circuit chip 110 may be electrically connected with pads 101 of the PCB substrate 300 for providing electrical connection with an external device. The chip pads 106 may be wire bonded to the pads 101 of the PCB substrate 300.

On the other hand, the input/output circuit chip 110, pads 105, and the core chips 120 through 160 may be electrically connected in the TSV manner. This will be more fully described with reference to FIG. 21.

Figure 21:
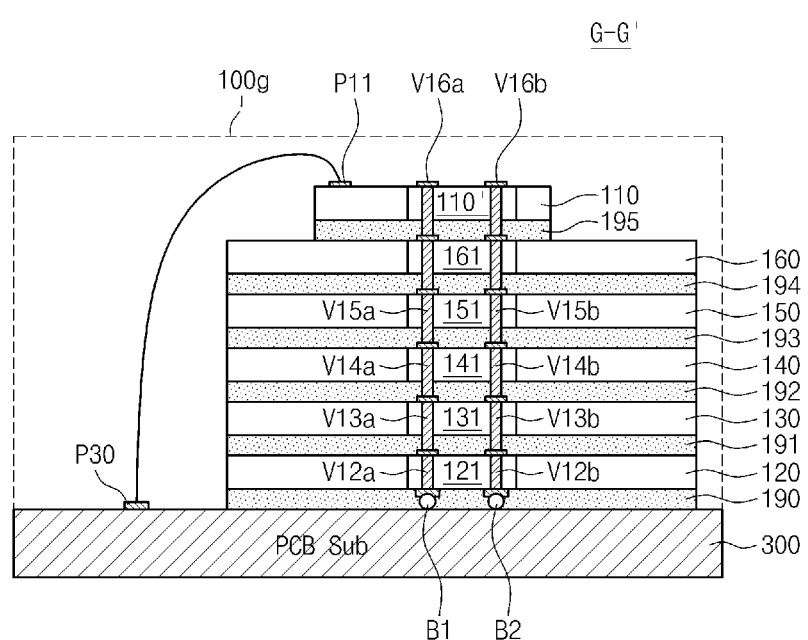
FIG. 21 is a cross-sectional view taken along a line G-G' of FIG. 20.

FIG. 21 is a cross-sectional view taken along a line G-G' of FIG. 20. Referring to FIG. 21, a memory device 100g may include a PCB substrate 300, an input/output circuit chip 110, and a plurality of stacked core chips 120 through 160.

The core chips 120 through 160 may be stacked on the PCB substrate 300. The first core chip 120 placed at the lowermost layer may include a chip region 121 for forming a through via. Vias V12a and V12b may be formed at the chip region 121 to penetrate the first core chip 120 vertically. Lower portions of the vias V12a and V12b of the first core chip 120 may be fixed to the PCB substrate 300 by external terminals B1 and B2. Herein, the external terminals B1 and B2 may be formed of a solder ball.

A through structure of the first core chip 120 may be identically applied to second through fifth core chips 130 through 160. Vias V13a and V13b may be formed at a chip region 131 of the second core chip 130. The vias V13a and V13b may be aligned with the vias V12a and V12b. Vias V14a and V14b may be formed at a chip region 141 of the third core chip 140. The vias V14a and V14b may be aligned with the vias V13a and V13b. Vias V15a and V15b may be formed at a chip region 151 of the fourth core chip 150. The vias V15a and V15b may be aligned with the vias V14a and V14b. Vias V16a and V16b may be formed at a chip region 161 of the fifth core chip 160. The vias V16a and V16b may be aligned with the vias V15a and V15b. As illustrated in FIG. 17, adhesive layers 190, 191, 192, 193, and 194 may be provided between the PCB substrate 300 and the core chip 120 and among the core chips 120 through 160.

The input/output circuit chip 110 may be stacked on the fifth core chip 160. The input/output circuit chip 110 may be connected with the core chips 120 through 160 via through vias V11a and V11b. The input/output circuit chip 110 may include a chip region 110' for forming through vias. An adhesive layer 195 may be provided between the fifth core chip 160 and the input/output circuit chip 110.

Figure 22:
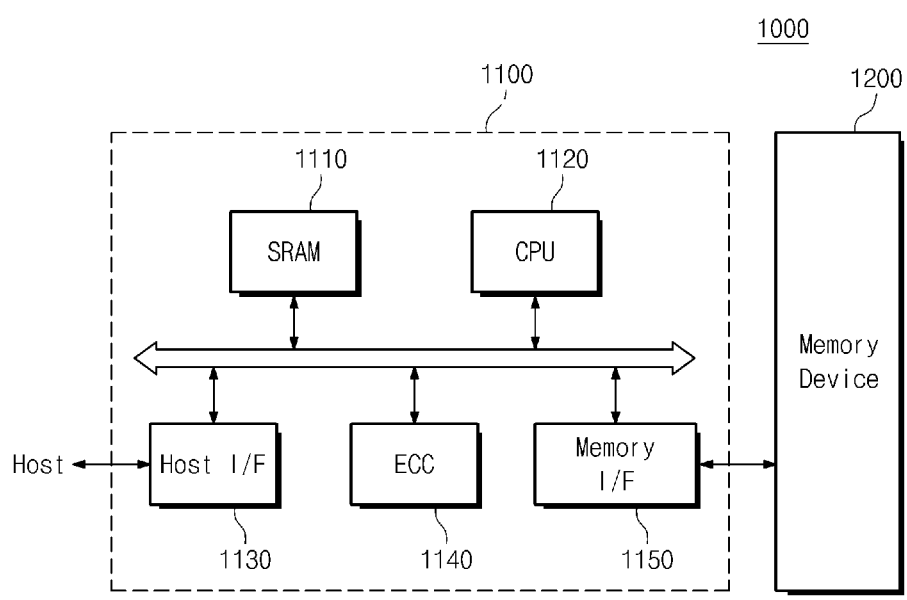
FIG. 22 is a block diagram illustrating a memory system according to an exemplary embodiment.

FIG. 22 is a block diagram illustrating a memory system according to an exemplary embodiment. Referring to FIG. 22, a memory system 1000 may include a memory controller 1100 and a memory device 1200.

The memory controller 1100 may be configured to control the memory device 1200. The memory device 1200 and the memory controller 1100 may constitute a memory card. An SRAM 1110 may be used as a working memory of a CPU 1120. A host interface 1130 may include the data exchange protocol of a host connected with the memory system 1000. An ECC circuit 1140 may be configured to detect and correct an error of data read out from the memory device 1200. A memory interface (I/F) 1150 may be configured to interface with the memory device 1200. As a processing unit, the CPU 1120 may be configured to perform an overall control operation for exchanging data. Although not shown, the memory system 1000 may further include a ROM which stores code data for interfacing with a host.

The memory device 1200 may include an input/output circuit chip and a core chip, which are fabricated using different design rules or processes. The memory device 1200 may be substantially identical to memory devices described in relation to FIGS. 1 through 21. The memory device 1200 can be formed of a multi-chip package including a plurality of flash memory chips.

The memory controller 1100 may be configured to communicate with an external device (e.g., a host) via one of various interface protocols such as USB, MMC, PCI-E, SAS, SATA, PATA, SCSI, ESDI, IDE, and the like.

Figure 23:
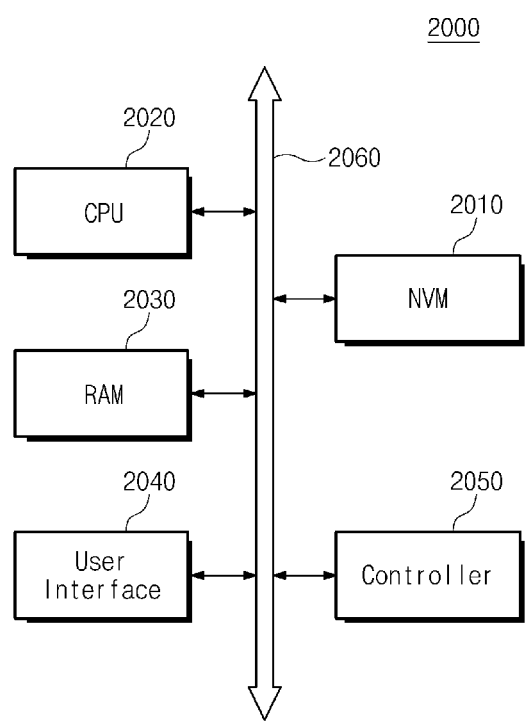
FIG. 23 is a block diagram schematically illustrating a computing system including a nonvolatile memory device or a random access memory (RAM) where an input/output circuit chip and a core chip are separated.

FIG. 23 is a block diagram schematically illustrating a computing system including a nonvolatile memory device or a RAM where an input/output circuit chip and a core chip are separated. Referring to FIG. 23, a computing system 2000 may include a CPU 2020, a RAM 2030, a user interface 2040, a modem 2050 such as a baseband chipset, and a nonvolatile memory 2010 which are electrically connected with a bus 2060.

In the event that the computing system 2000 is a mobile device, it may further comprise a battery (not shown) for powering the computing system 2000. Although not shown, the computing system 2000 may further include an application chipset, a camera image processor (CIS), a mobile DRAM, and the like.

Herein, the nonvolatile memory device 2010 or the RAM 2030 may include an input/output circuit chip and a core chip, which are fabricated using different design rules or processes. The nonvolatile memory device 2010 or the RAM 2030 may be substantially identical to memory devices described in relation to FIGS. 1 through 21.

In some exemplary embodiments, a memory device and/or a memory controller may be packed by various types of packages such as Package on Package (PoP), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other exemplary embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A memory device comprising:
a first semiconductor chip including a memory element and a peripheral circuit configured to write or read data in or from the memory element; and
a second semiconductor chip configured to perform an input/output function of data or signals exchanged between an external device and the first semiconductor chip,
wherein the second semiconductor chip comprises:
an input driver configured to control a level of data input to an input/output terminal from the external device;
a data input buffer configured to buffer data provided from the input driver and to transfer the buffered data to the first semiconductor chip;
a data output buffer configured to buffer output data provided from the first semiconductor chip; and
an output driver configured to control a level of the output data buffered in the data output buffer and to output the controlled level of the output data to the external device via the input/output terminal.

2. The memory device of claim 1, wherein the first semiconductor chip has a first minimum feature size and the second semiconductor chip has a second minimum feature size, which is different from the first minimum feature size.

3. The memory device of claim 1, wherein the second semiconductor chip further comprises:

an electro-static discharge (ESD) circuit connected to the input/output terminal and configured to prevent an unintended high voltage flowing in to the input/output terminal.

4. The memory device of claim 1, wherein the second semiconductor chip further comprises:
an impedance control circuit connected to the input/output terminal and configured to control a termination impedance of the input/output terminal.

5. The memory device of claim 1, wherein the second semiconductor chip further comprises:
a de-emphasis driver configured to modulate the output data between the input/output terminal and the data output buffer so as to filter direct current (DC) and high-frequency components of the output data.

6. The memory device of claim 5, wherein the second semiconductor chip further comprises:
a switch configured to selectively transfer output data from the data output buffer to either one of the output driver and the de-emphasis driver.

7. The memory device of claim 1, wherein the second semiconductor chip further comprises:
a serial-to-parallel convertor configured to parallelize an input data stream provided from the data input buffer and to serialize an output data stream transferred from the first semiconductor chip to provide the serialized data to the data output buffer.

8. The memory device of claim 1, wherein the peripheral circuit includes a read/write circuit.

9. The memory device of claim 2, wherein the first semiconductor chip includes elements having the minimum feature size smaller than a reference and the second semiconductor chip includes elements having the minimum feature size identical to or larger than the reference.

10. A memory device comprising:
a printed circuit board substrate;
a first core chip located on the printed circuit board substrate;
a first input/output circuit chip provided on the printed circuit board substrate and configured to perform an input/output function of data or signals input or output to or from the first core chip;
a second core chip stacked on the first core chip; and
a second input/output circuit chip stacked on the first core chip and configured to perform an input/output function of data or signals input or output to or from the second core chip,
wherein the first input/output chip and the second input/output circuit chip are located on the printed circuit board so as to minimize a number of bonding wires between the first core chip and the second core chip.

11. The memory device of claim 10, wherein the first input/output circuit chip is electrically connected to chip pads arranged at a side of the second core chip.

12. The memory device of claim 11, wherein the second input/output circuit chip is electrically connected to chip pads of the first core chip and chip pads of the second core chip.

13. The memory device of claim 10, wherein an area of the second core chip is larger than an area of the first core chip.

14. The memory device of claim 10, wherein the first input/output circuit chip or the second input/output circuit chip includes at least one of an input/output driver controlling a data or signal level, an input/output buffer, an ESD circuit, an impedance control circuit, a de-emphasis driver, or a serial-to-parallel circuit.

15. A memory device comprising:
a printed circuit board substrate;
a first core chip provided on the printed circuit board substrate;
a first input/output circuit chip provided on the printed circuit board substrate and at a side of the first core chip and configured to perform an input/output function of data input and output to and from the first core chip; and
a second core chip stacked on the first core chip and the first input/output circuit chip.

16. The memory device of claim 15, wherein the second core chip has a rectangle shape having a same width and length as the first core chip and is rotated in a direction vertical to the first core chip so as to be stacked.

17. The memory device of claim 15, wherein the first input/output circuit chip is located at a space corresponding to an overhang of the second core chip to the first core chip.

18. The memory device of claim 15, further comprising:
a second input/output circuit chip located at a right angle to the side of the first core chip and configured to perform an input/output function of data of the second core chip.

19. A memory device comprising:
an input/output circuit chip configured to exchange data or signals with an external device, wherein the input/output circuit chip comprises at least one of a data input buffer, an input driver, an output driver and an output buffer; and
a plurality of core chips stacked in a vertical direction,
wherein each of the plurality of core chips stores data provided from the input/output circuit chip in response to signals provided to the input/output circuit chip and reads internal data in response to signals provided to the input/output circuit chip, the read data being output to the input/output circuit chip.

20. The memory device of claim 19, wherein the input/output circuit chip has a minimum feature size different from a minimum feature size of at least one of the plurality of core chips.

21. The memory device of claim 19, wherein each of the plurality of core chips includes chip pads which are electrically interconnected via bonding wires.

22. The memory device of claim 19, wherein the plurality of core chips are electrically interconnected via through silicon vias.

23. The memory device of claim 22, further comprising:
a printed circuit board substrate provided below the input/output circuit chip and the plurality of core chips, and
wherein the through silicon vias of the input/output circuit chip are electrically connected to the through silicon vias of the plurality of core chips via a circuit pattern formed on the printed circuit board substrate.

24. The memory device of claim 19, wherein the input/output circuit chip is stacked on an uppermost layer of the plurality of core chips, and the input/output circuit chip and the plurality of core chips are electrically connected via a through silicon via formed as a common electrode.

25. A memory device comprising:
a cell array including a plurality of memory elements; and
a peripheral circuit configured to write or read data in or from the memory elements,
wherein an input/output circuit that transfers data to the peripheral circuit or outputs data from the peripheral circuit is provided outside the memory device, wherein the input/output circuit comprises at least one of a data input buffer, an input driver, an output driver and an output buffer.

26. A memory device comprising:
a core chip; and
an input/output circuit chip on a separate chip die separated from the core chip, wherein the input/output circuit chip comprises unscalable elements, and the core chip comprises elements which are scalable.

27. The memory device of claim 26, wherein the input/output chip comprises elements having a first minimum feature size, and the core chip comprises elements having a second minimum feature size which is smaller than the first minimum feature size.

* * * * *